(12) United States Patent
Huang et al.

(10) Patent No.: US 11,101,339 B2
(45) Date of Patent: Aug. 24, 2021

(54) FLEXIBLE DISPLAY PANEL AND MANUFACTURING METHOD THEREOF, AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Weiyun Huang, Beijing (CN); Yue Long, Beijing (CN)

(73) Assignees: BOE TECHNOLOGY GROUP CO., LTD., Beijing (CN); CHENGDU BOE OPTOELECTRONICS TECHNOLOGY CO., LTD, Chengdu (CN)

( * ) Notice: Subject to any disclaimer, the term of this patent is extended or adjusted under 35 U.S.C. 154(b) by 605 days.

(21) Appl. No.: 16/074,114

(22) PCT Filed: Sep. 12, 2017

(86) PCT No.: PCT/CN2017/101421
§ 371 (c)(1),
(2) Date: Jul. 31, 2018

(87) PCT Pub. No.: WO2018/176740
PCT Pub. Date: Oct. 4, 2018

(65) Prior Publication Data
US 2021/0210579 A1 Jul. 8, 2021

(30) Foreign Application Priority Data
Mar. 30, 2017 (CN) .......................... 201710201921.8

(51) Int. Cl.
*H01L 27/32* (2006.01)
*H01L 51/00* (2006.01)
(Continued)

(52) U.S. Cl.
CPC ...... *H01L 27/3276* (2013.01); *H01L 51/0097* (2013.01); *H01L 51/5253* (2013.01); *H01L 51/56* (2013.01); *G09F 9/301* (2013.01)

(58) Field of Classification Search
None
See application file for complete search history.

(56) References Cited

U.S. PATENT DOCUMENTS

| 2015/0137102 A1 | 5/2015 | Yang |
| 2016/0218305 A1 | 7/2016 | Kim et al. |
| 2016/0291438 A1 | 10/2016 | Lo et al. |

FOREIGN PATENT DOCUMENTS

| CN | 104950535 A | 9/2015 |
| CN | 105826350 A | 8/2016 |

(Continued)

OTHER PUBLICATIONS

The International Search Report (including English translation) for PCT Application No. PCT/CN2017/101421 dated Jan. 9, 2018.

(Continued)

*Primary Examiner* — Vip Patel
(74) *Attorney, Agent, or Firm* — Fay Sharpe LLP

(57) ABSTRACT

A flexible display panel, a manufacturing method thereof and a display device are provided. The flexible display panel includes a flexible base substrate, a conductive layer arranged in display area of the flexible base substrate, a plurality of wires arranged in an edge bending area of the substrate, and inorganic insulating layer, the inorganic insulating layer is arranged between the conductive layer and the flexible base substrate, and between the plurality of wires and the flexible base substrate. The conductive layer is electrically connected with the plurality of wires. The panel further includes: first organic insulating layer which is at least arranged in the edge bending area of the flexible base substrate, and located between the plurality of wires and the (Continued)

inorganic insulating layer. The first organic insulating layer may prevent crack caused in the inorganic insulating layer from extending to a plurality of wires, the display failure is avoided.

19 Claims, 14 Drawing Sheets

(51) Int. Cl.
    *H01L 51/56*         (2006.01)
    *H01L 51/52*         (2006.01)
    *G09F 9/30*          (2006.01)

(56) References Cited

FOREIGN PATENT DOCUMENTS

| CN | 105892192 A | 8/2016 |
| CN | 106920829 A | 7/2017 |
| CN | 106972030 A | 7/2017 |

OTHER PUBLICATIONS

First Office Action and English translation thereof for CN Application No. 201710201921.8 dated Dec. 5, 2018.

FLEXIBLE DISPLAY PANEL AND MANUFACTURING METHOD THEREOF, AND DISPLAY DEVICE

This application is a 371 of PCT Patent Application Serial No. PCT/CN2017/101421 filed Sep. 12, 2017, which claims priority to Chinese Patent Application No. 201710201921.8, filed with the State Intellectual Property Office on Mar. 30, 2017 and titled "FLEXIBLE DISPLAY PANEL AND MANUFACTURING METHOD THEREOF, AND DISPLAY DEVICE," the entire contents of which are incorporated herein by reference.

TECHNICAL FIELD

The present disclosure relates to display technology, and more particularly to a flexible display panel, a manufacturing method thereof and a display device.

BACKGROUND

Recently, the display market is booming. Moreover, more new display products will emerge with consumers' increasing demand for various display products, such as laptop computers, smart phones, TVs, tablet computers, smart watches and fitness wristbands.

SUMMARY

The present disclosure provides a flexible display panel. The flexible display panel includes a flexible base substrate, a plurality of wires arranged in an edge bending area of the flexible base substrate, and an inorganic insulating layer. The inorganic insulating layer is arranged between the plurality of wires and the flexible base substrate. The flexible display panel further includes: a first organic insulating layer which is at least arranged in the edge bending area of the flexible base substrate, and is located between the plurality of wires and the inorganic insulating layer.

In a possible implementation, the above flexible display panel further comprises: a conductive layer arranged in a display area of the flexible base substrate. The inorganic insulating layer is arranged between the conductive layer and the flexible base substrate. The conductive layer is electrically connected with the plurality of wires.

In a possible implementation, in the above flexible display panel, the first organic insulating layer is further arranged in the display area of the flexible base substrate, and is located between the conductive layer and the inorganic insulating layer.

In a possible implementation, in the above flexible display panel, the conductive layer and the plurality of wires are arranged on the same layer.

In a possible implementation, the conductive layer is a source-drain electrode metal layer.

In a possible implementation, the inorganic insulating layer includes a gate insulating layer and an interlayer insulating layer.

In a possible implementation, in the above flexible display panel, the first organic insulating layer is made of polyimide or polymethyl methacrylate.

In a possible implementation, the above flexible display panel further includes: a second organic insulating layer at least arranged in the edge bending area of the flexible base substrate, and located on the plurality of wires.

In a possible implementation, in the above flexible display panel, the second organic insulating layer is arranged on the same layer as a planarization layer, a photo spacer layer or a pixel definition layer arranged in the display area of the flexible base substrate.

In a possible implementation, the above flexible display panel further includes: an organic light-emitting diode or a quantum dot light-emitting diode arranged above the conductive layer in the display area of the flexible base substrate.

In a possible implementation, the conductive layer and the plurality of wires are made of one or an alloy combination of molybdenum, aluminum, tungsten, titanium and copper.

In a possible implementation, the conductive layer and the plurality of wires are a composite metal layer made of titanium, aluminum and titanium.

In a possible implementation, the planarization layer is made of polyacrylic resin, polyepoxy acrylic resin, photosensitive polyimide resin, polyester acrylate, urethane acrylate resin, or phenolic epoxy acrylate resin.

The present disclosure further provides a display device. The display device includes the flexible display panel above.

The present disclosure further provides a manufacturing method of a flexible display panel. The method includes: providing a flexible base substrate; forming an inorganic insulating layer in a display area and an edge bending area of the flexible base substrate; forming a first organic insulating layer on the inorganic insulating layer in the edge bending area of the flexible base substrate; and forming a conductive layer on the inorganic insulating layer in the display area of the flexible base substrate, and forming a plurality of wires on the first organic insulating layer in the edge bending area of the flexible base substrate simultaneously, the conductive layer being electrically connected with the plurality of wires.

In a possible implementation, in the above manufacturing method, forming the first organic insulating layer on the inorganic insulating layer in the edge bending area of the flexible base substrate includes: forming the first organic insulating layer on the inorganic insulating layer in the edge bending area and the display area of the flexible base substrate by one-step patterning.

In a possible implementation, in the above manufacturing method, the conductive layer is a source-drain electrode metal layer; and forming the inorganic insulating layer in the display area and the edge bending area of the flexible base substrate includes: sequentially forming a gate insulating layer and an interlayer insulating layer in the display area and the edge bending area of the flexible base substrate.

In a possible implementation, after forming the conductive layer on the inorganic insulating layer in the display area of the flexible base substrate, and forming the plurality of wires on the first organic insulating layer in the edge bending area of the flexible base substrate simultaneously, the manufacturing method further includes: forming a second organic insulating layer on the plurality of wires in the edge bending area of the flexible base substrate.

In a possible implementation, in the above manufacturing method, forming the second organic insulating layer on the plurality of wires in the edge bending area of the flexible base substrate includes: forming a planarization layer, a photo spacer layer or a pixel definition layer in the display area of the flexible base substrate while forming the second organic insulating layer on the plurality of wires in the edge bending area of the flexible base substrate through one-step patterning.

BRIEF DESCRIPTION OF THE DRAWINGS

FIG. 1b is an enlarged view of a structure of the dotted part in FIG. 1a;

DETAILED DESCRIPTION

Figure 1A:
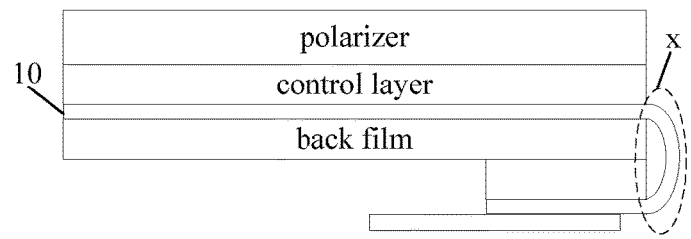
FIG. 1a is a structural schematic view of a flexible display panel in the prior art.

The flexible display panel, the manufacturing method thereof and the display device provided in the embodiments of the present disclosure will be described in further detail with reference to the enclosed drawings.

Thicknesses, shapes and sizes of all film layers in the drawings are merely intended to illustrate the present disclosure, rather than reflecting the true scale of a flexible display panel.

Figure 1B:
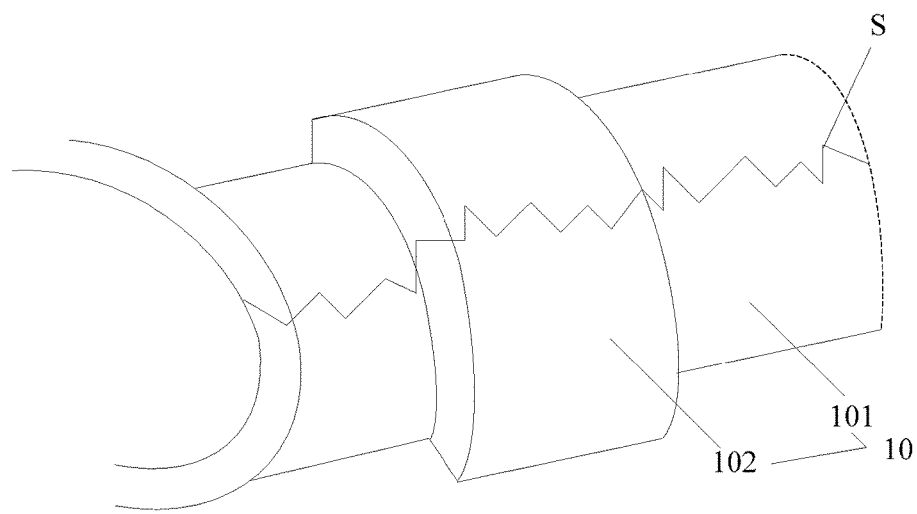
Figure 2:
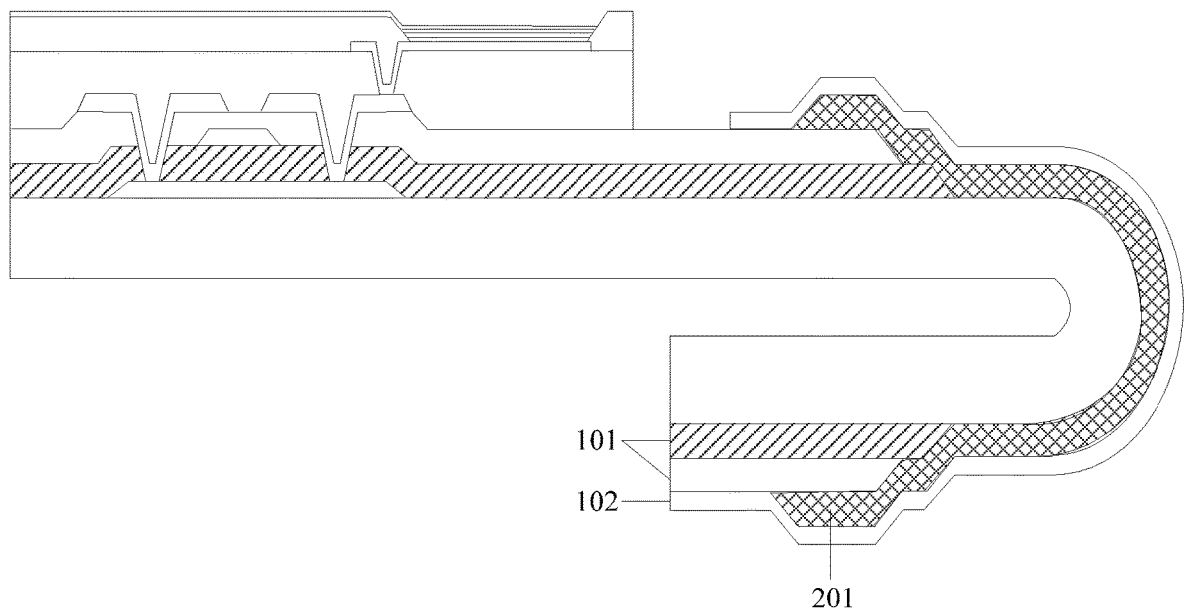
FIG. 2 is another structural schematic view of a flexible display panel in the prior art.

Full-screen frameless display products will certainly be the bombs in the new consumer market as they provide a better viewing experience for users. Pad bending is the core technology for the full-screen frameless display products. Referring to FIGS. 1a and 1b, FIG. 1a is a schematically structural view of a display product; and FIG. 1b is an enlarged view of a partial structure in a circular area x in FIG. 1a. As shown in FIG. 1a, the display product generally comprises a back film, a flexible substrate 10, a control layer and a polarizer which are laminated. As shown in FIG. 1b, the flexible substrate 10 comprises an inorganic insulating layer 101 and a signal line layer 102 which are laminated. As the inorganic insulating layer 101 is too brittle, a crack S will appear in the inorganic insulating layer 101 in a bending area of the display product during pad bending. This crack S further extends to the signal line layer 102, resulting in display failure. In order to avoid the crack S in the inorganic insulating layer 101 in the bending area, as shown in FIG. 2, a mask process is added in the prior art to remove the inorganic insulating layer 101 in the bending area; then, another mask process is added to form an organic insulating layer 201 in the bending area; and then, the signal line layer 102 is formed on the organic insulating layer 201. In this way, there is no inorganic insulating layer 101 in the bending area, so that the crack is unlikely to be generated in pad bending, or further extends to the signal line layer 102, thereby effectively preventing display failure.

It can be seen from the above description that the mask process is performed twice additionally in the prior art to solve the problem of display failure caused by the crack in the inorganic insulating layer in the bending area. The production cost is increased, and improvement of the production efficiency is difficult. Therefore, how to avoid the display failure caused by the crack in the inorganic insulating layer in the bending area under the condition of low production cost is a technical problem that needs to be solved urgently.

According to an embodiment of the present disclosure, there is provided a flexible display panel, comprising a display area and a non-display area. The non-display area of the flexible display panel may be an area close to the side edge on the surface of the flexible display panel. The non-display area surrounds the display area, which is also called as an active area (AA). The non-display area is an area outside the display area on the flexible display panel, and is bendable. That is, the non-display area comprises an edge bending area.

Figure 3A:
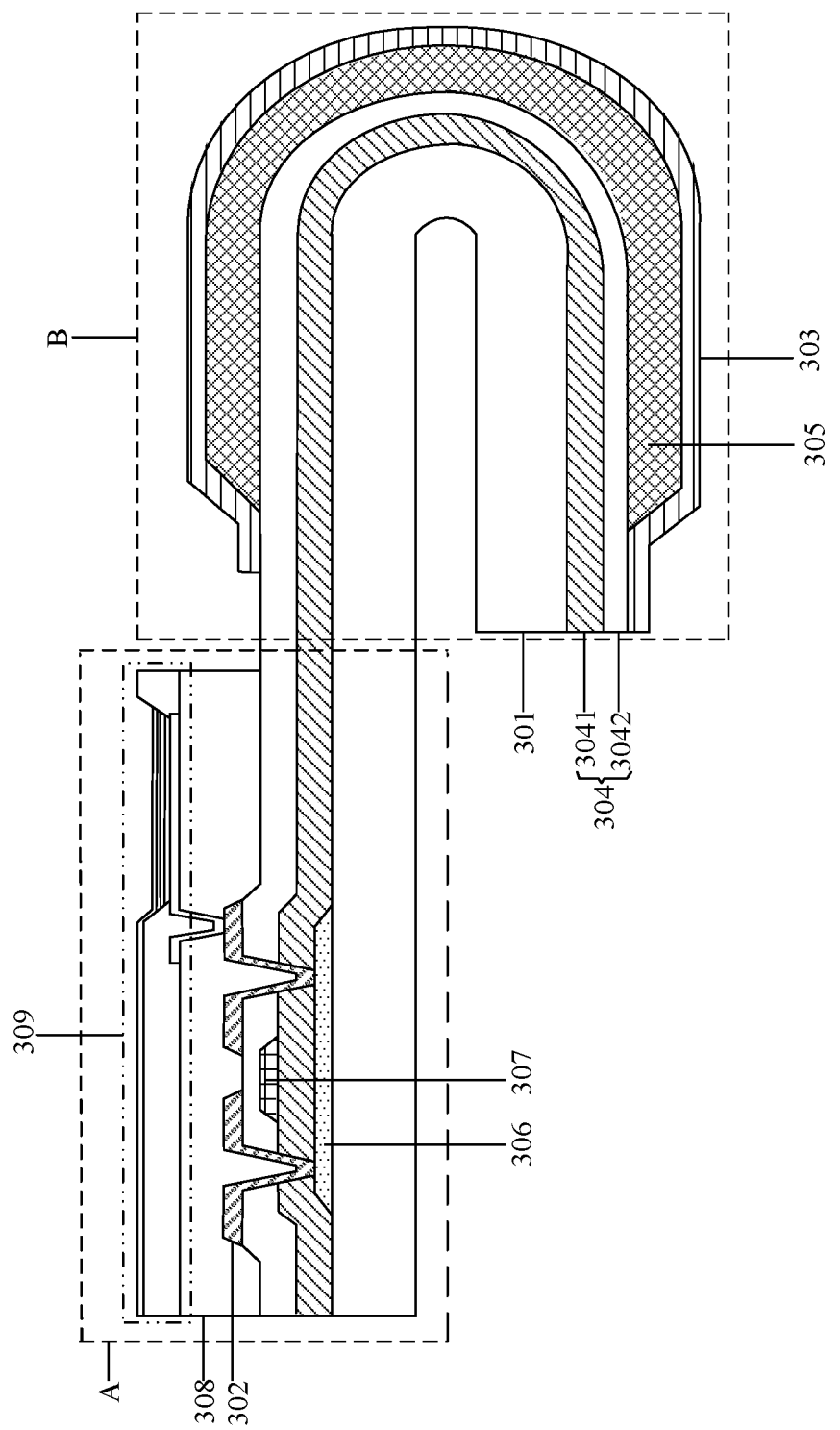
FIG. 3a is a structural schematic view of a flexible display panel provided in an embodiment of the present disclosure.
Figure 3B:
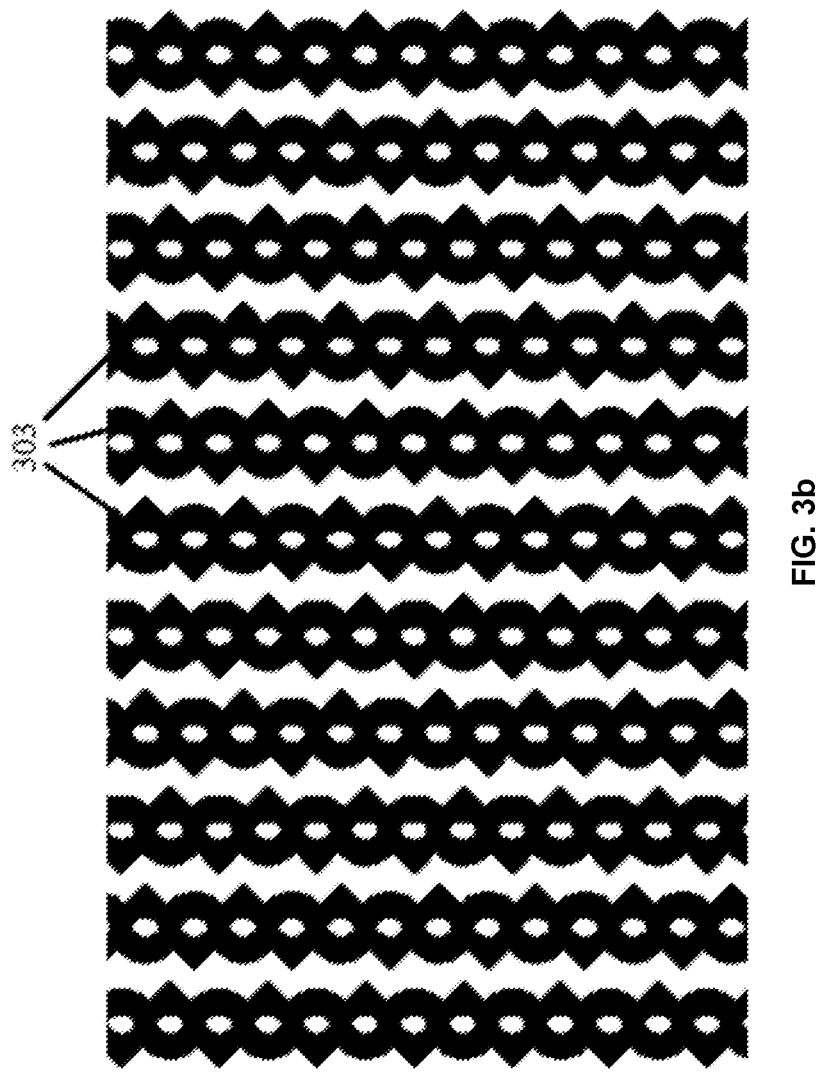
FIG. 3b is a top view of a bending area B of a flexible display panel provided in an embodiment of the present disclosure.

Referring to FIG. 3a, the flexible display panel includes a flexible base substrate 301, a conductive layer 302 arranged in a display area A of the flexible base substrate, a plurality of wires 303 arranged in an edge bending area B of the flexible base substrate, and an inorganic insulating layer 304. The inorganic insulating layer 304 is between the conductive layer 302 and the flexible base substrate 301, and between the plurality of wires 303 and the flexible base substrate 301. That is, the inorganic insulating layer 304 is arranged between the conductive layer 302 and the flexible base substrate 301, and is also arranged between the he plurality of wires 303 and the flexible base substrate 301, The conductive layer 302 is electrically connected with the plurality of wires 303. FIG. 3b is a top view of a bending area of a flexible display panel provided in an embodiment of the present disclosure. In an implementation, the flexible display panel may include: a first organic insulating layer 305 which is at least arranged in the edge bending area B of the flexible base substrate, and is located between the plurality of wires 303 and the inorganic insulating layer 304. The first organic insulating layer 305 may be made of polyimide, such as photosensitive polyimide photoresist, and may also be of polymethyl methacrylate. The flexible base substrate 301 may be made of polyimide, which is not limited herein.

In the above flexible display panel provided in some embodiments of the present disclosure, the first organic insulating layer 305 is arranged in the edge bending area B of the flexible base substrate, and is located between the plurality of wires 303 and the inorganic insulating layer 304. Therefore, when there is a crack in the inorganic insulating layer 304 in the edge bending area B of the flexible base substrate, the crack is effectively prevented from extending to a film layer of the plurality of wires 303 as the first organic insulating layer 305 located between the wires 303 and the inorganic insulating layer 304 plays a shielding effect, and thus display failure is avoided. In addition, compared with the technical solution in the prior art that the mask process is performed twice additionally, the technical solution of the present disclosure only adds one mask process for manufacturing the first organic insulating layer 305, so that the other mask process for removing the inorganic insulating layer 304 in the edge bending area B of the flexible base substrate is eliminated, thereby reducing the production cost and improving the production efficiency.

During an implementation, in the above flexible display panel provided in some embodiments of the present disclosure, as shown in FIG. 3a, the conductive layer 302 and the plurality of wires 303 are arranged on the same layer. The conductive layer 302 comprises a source-drain electrode metal layer and a signal line, and may be a composite metal layer made of titanium, aluminum and titanium. The inorganic insulating layer 304 comprises a gate insulating (GI) layer 3041 and an interlayer insulating layer 3042 located at the side of the gate insulating layer 3041 far from the flexible base substrate 301. The conductive layer 302 and the plurality of wires 303 may be made of one or an alloy combination of molybdenum, aluminum, tungsten, titanium and copper, which is not limited herein. The interlayer insulating layer 3042 may be an inter dielectric layer (IDL). The inorganic insulating layer 304 may be made of one or a combination of silicon oxide and silicon nitride, which is not limited herein. In addition, the conductive layer 302 and the plurality of wires 303 are arranged on the same layer. Thus, the conductive layer 302 and the plurality of wires 303 may be simultaneously prepared by a one-step patterning process, so that the preparation process is simplified and the production cost is reduced.

Exemplarily, as shown in FIG. 3a, the above flexible display panel provided in some embodiments of the present disclosure may further comprise an active layer 306 located between the flexible base substrate 301 and the gate insulating layer 3041, and a gate electrode metal layer 307 and a gate scanning line (not shown in FIG. 3a) which are located between the gate insulating layer 3041 and the interlayer insulating layer 3042. Exemplarily, the active layer 306 may be made of a polysilicon semiconductor material, an amorphous silicon semiconductor material, an oxide semiconductor material or an organic semiconductor material, which is not limited herein. The gate electrode metal layer 307 and the gate scanning line may be made of one or an alloy combination of molybdenum, aluminum, tungsten, titanium and copper, which is not limited herein.

Exemplarily, as shown in FIG. 3a, the above flexible display panel provided in some embodiments of the present disclosure may further comprise a planarization layer 308 and an organic light-emitting diode 309 or quantum dot light-emitting diode (QLED) 309 which are sequentially arranged above the conductive layer 302 in the display area A of the flexible base substrate. The planarization layer 308 may be made of an organic insulating material such as polyacrylic resin, polyepoxy acrylic resin, photosensitive polyimide resin, polyester acrylate, urethane acrylate resin, or phenolic epoxy acrylate resin, which is not limited herein. In the display area A of the flexible base substrate, the source-drain electrode metal layer (not shown in FIG. 3a) in the conductive layer 302 is connected to the active layer 306 below the conductive layer 302 through a via hole in the inorganic insulating layer 304, so that the segment difference at different positions of the display area A of the flexible base substrate is relatively large, which may affect the manufacture of a film layer on the conductive layer 302 subsequently. The planarization layer 308 covering the conductive layer 302 may reduce the segment difference at the different positions of the display area A of the flexible base substrate, so that the display area A of the flexible substrate may be relatively smooth, facilitating the formation of the film layer subsequently.

Since the structure of the flexible display panel provided in another embodiment is similar to that of the flexible display panel provided in the above embodiment, only the difference between the flexible display panel provided in the another embodiment and the flexible display panel provided in the above embodiment is introduced, and repeated descriptions are eliminated herein.

Figure 4:
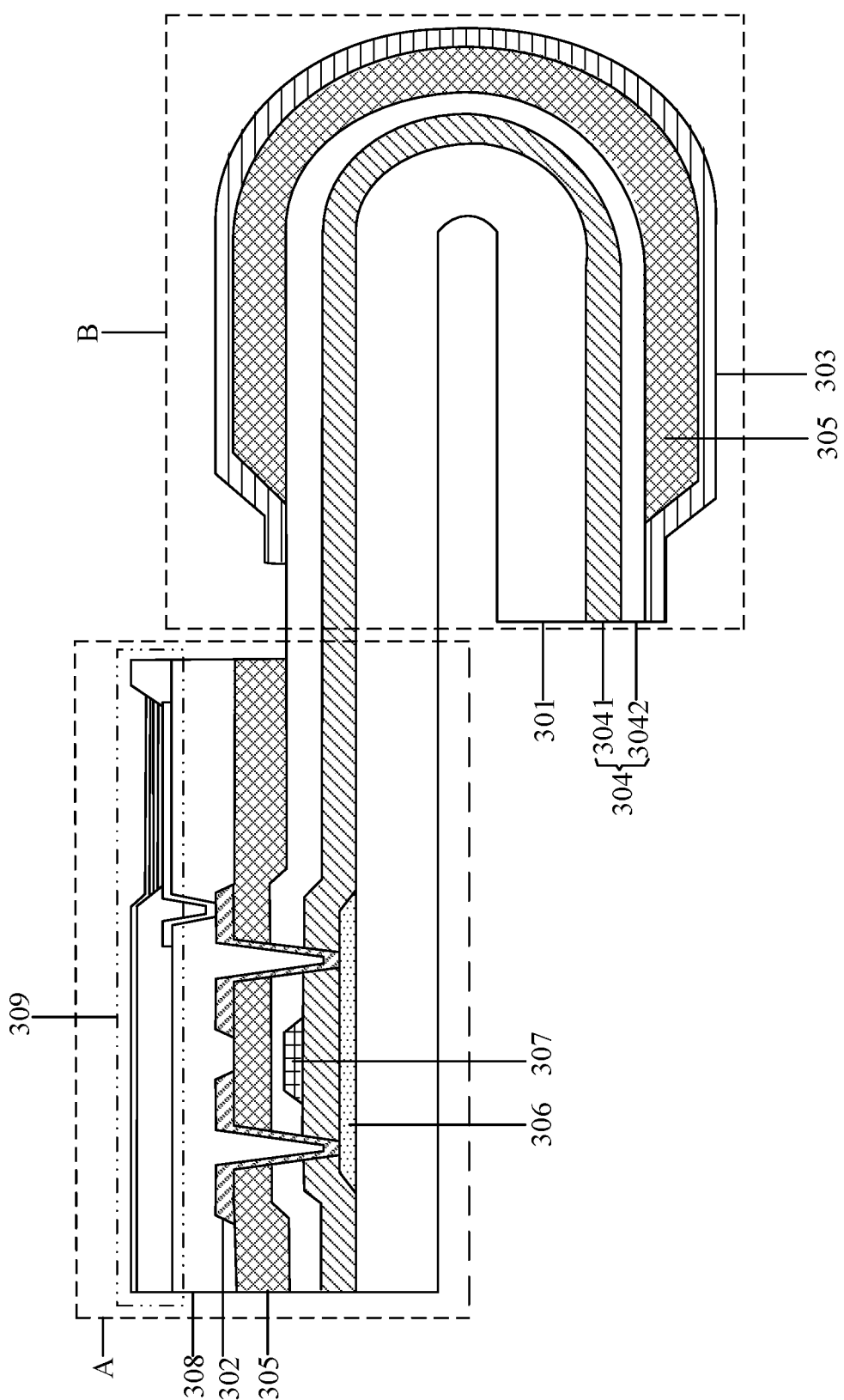
FIG. 4 is a structural schematic view of a flexible display panel provided in an embodiment of the present disclosure.

Exemplarily, the first organic insulating layer 305 in the flexible display panel provided in some embodiments is only arranged between the plurality of wires 303 and the inorganic insulating layer 304. However, as shown in FIG. 4, the first organic insulating layer 305 in a flexible display panel provided in some embodiments may be arranged not only between the plurality of wires 303 and the inorganic insulating layer 304, but also in the display area A of the flexible base substrate. Meanwhile, the first organic insulating layer 305 arranged in the display area A of the flexible base substrate may be located between the conductive layer 302 and the inorganic insulating layer 304. Thus, through the first organic insulating layer 305 between the conductive layer 302 and the inorganic insulating layer 304, the capacitance between the gate scanning line and the conductive layer 302, i.e., the source-drain electrode metal layer may be effectively reduced, which facilitates the improvement of the display image quality.

Additionally, the material of the film layers in the flexible display panel provided in the another embodiment can be similar to that of the film layers in the flexible display panel provided in some embodiments of the present disclosure, which is not repeated herein. For the meaning of other reference numerals in FIG. 4, reference may be made to those in FIG. 3a, and will not be repeated herein.

Since the structure of the flexible display panel provided in an yet another embodiment is similar to that of the flexible display panel provided in the above another embodiment, only the difference therebetween is introduced, and repeated descriptions are eliminated herein.

Figure 5:
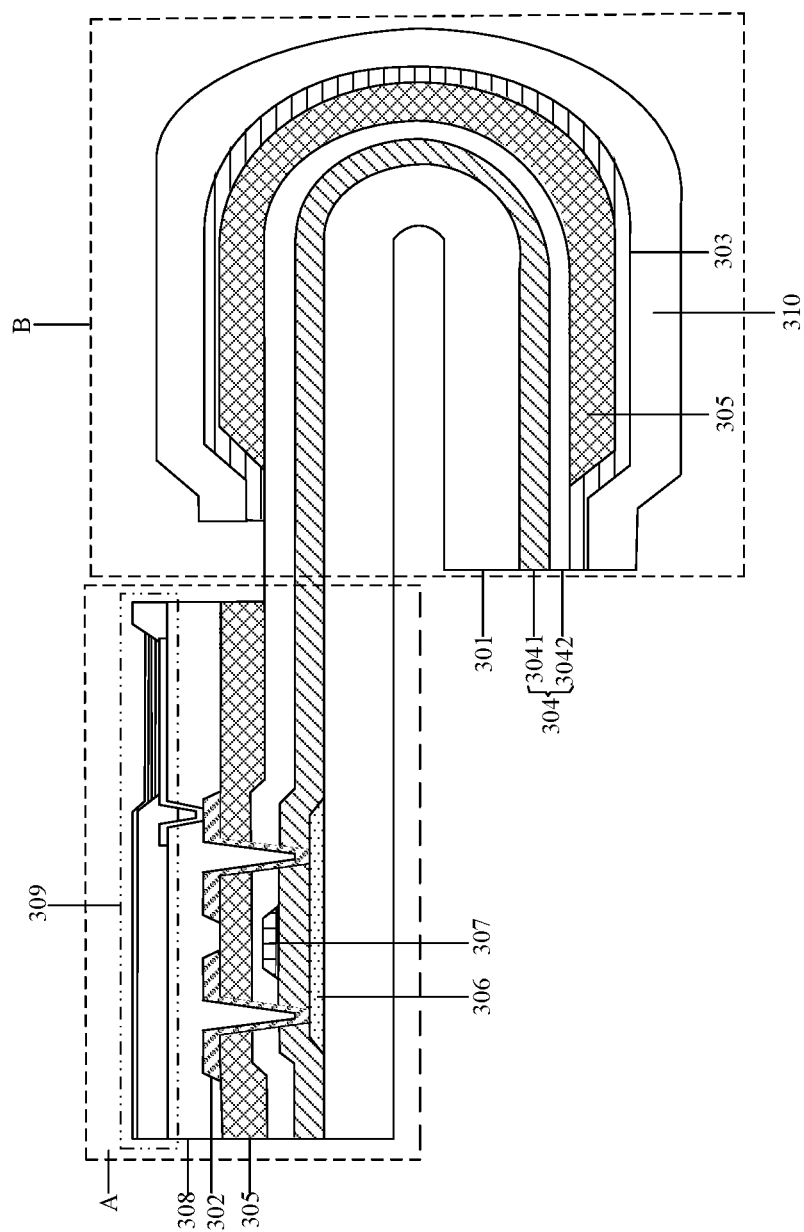
FIG. 5 is a structural schematic view of a flexible display panel provided in an embodiment of the present disclosure.

Exemplarily, on the basis of the flexible display panel provided in some embodiments of the present disclosure, in order to prevent the plurality of wires 303 in the edge bending area B of the flexible base substrate from being scratched, as shown in FIG. 5, a flexible display panel provided in some embodiments is additionally provided with a second organic insulating layer 310 that is at least arranged in the edge bending area B of the flexible base substrate. Moreover, the second organic insulating layer 310 is located above the plurality of wires 303. That is, the second organic insulating layer 310 is located at the side, far from the flexible base substrate 301, of the wires 303. In this way, the second organic insulating layer 310 can protect the plurality of wires 303 from being scratched, and thus the display image quality may be improved. For the meaning of other reference numerals in FIG. 5, reference may be made to those in FIG. 3a, and will not be repeated herein.

Exemplarily, in the above flexible display panel provided in some embodiments of the present disclosure, the second organic insulating layer 310 may be a film layer separately arranged, or may be a film layer arranged on the same layer as the planarization layer 308 in the display area A of the flexible base substrate, which is not limited herein. When the second organic insulating layer 310 and the planarization layer 308 are arranged on the same layer, the second organic insulating layer 310 and the planarization layer 308 may be simultaneously prepared through a one-step patterning process, so that the preparation process is simplified, and the production cost is reduced. In addition, as a pixel organic layer in the display area A of the flexible base substrate generally comprises a planarization layer, a photo spacer (PS) layer and a pixel definition layer (PDL), in an implementation, the second organic insulating layer 310 may also be arranged on the same layer as the photo spacer layer or the pixel definition layer, which is not limited herein.

In addition, the material of the film layers in the flexible display panel provided in some embodiments can be the same as that of the film layers in the flexible display panel provided in the aforesaid another embodiment, so details are not repeated herein. For the meaning of other reference numerals in FIG. 5, reference may be made to those in FIG. 3a, and will not be repeated herein.

It should be noted that, in an implementation, the above flexible display panel provided in the aforesaid yet another embodiment may also be modified based on the flexible display panel provided in some embodiments of the present disclosure. Exemplarily, in the flexible display panel provided in the aforesaid yet another embodiment, only the second organic insulating layer 310 that is at least arranged on the plurality of wires 303 in the edge bending area B of the flexible base substrate is additionally provided, and the first organic insulating layer 305 may not be arranged between the conductive layer 302 in the display area A of the flexible base substrate and the inorganic insulating layer 304.

Figure 6:
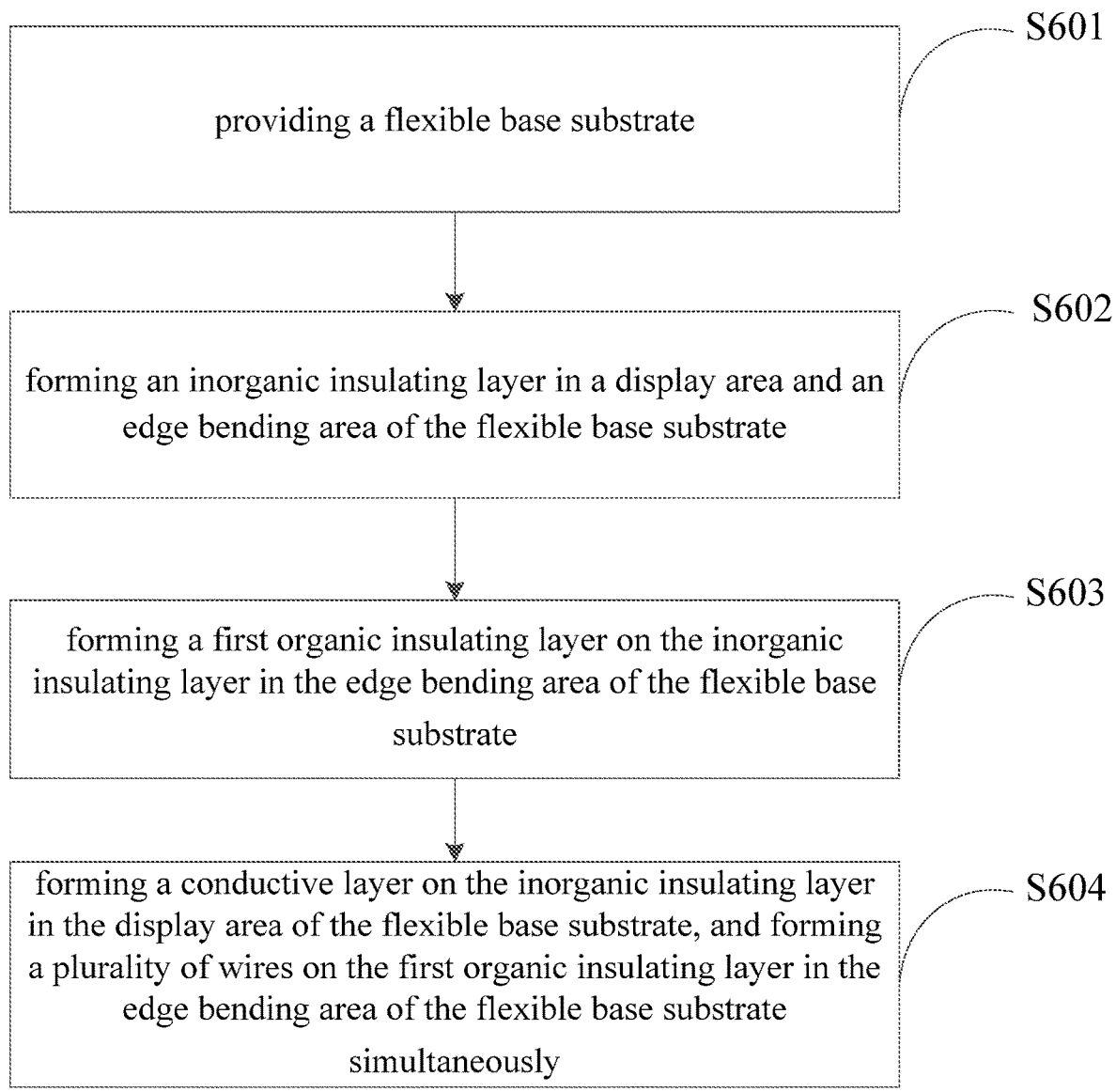
FIG. 6 is a flow chart of a method for manufacturing a flexible display panel provided in an embodiment of the present disclosure.

Accordingly, for the above flexible display panel provided in some embodiments of the present disclosure, there provides in an embodiment of the present disclosure a method for manufacturing a flexible display panel. Referring to FIG. 6, the method may include the following steps.

S601: a flexible base substrate is provided;

S602: an inorganic insulating layer is formed in a display area and an edge bending area of the flexible base substrate;

S603: a first organic insulating layer is formed on the inorganic insulating layer in the edge bending area of the flexible base substrate; and S604: a conductive layer is formed on the inorganic insulating layer in the display area of the flexible base substrate, and a plurality of wires are formed on the first organic insulating layer in the edge bending area of the flexible base substrate simultaneously.

Exemplarily, in the manufacturing method provided in some embodiments of the present disclosure, the conductive layer comprises a source-drain electrode metal layer and a signal line. In step S602, forming the inorganic insulating layer in the display area and the edge bending area of the flexible base substrate may be implemented through the following manner.

A gate insulating layer and an interlayer insulating layer may be sequentially formed in the display area and the edge bending area of the flexible base substrate through a patterning process.

In an implementation, with the above manufacturing method provided in some embodiments, before forming the gate insulating layer in the display area and the edge bending area of the flexible base substrate in S602, the manufacturing method may further comprise: forming an active layer in the display area of the flexible base substrate. Moreover, between forming the gate insulating layer in the display area and the edge bending area of the flexible base substrate and forming the interlayer insulating layer in the display area and the edge bending area of the flexible base substrate in S602, the manufacturing method may further comprise: forming a gate electrode metal layer and a gate scanning line on the gate insulating layer in the display area of the flexible base substrate.

In an implementation, with the manufacturing method provided in some embodiments, after the conductive layer is formed on the inorganic insulating layer in the display area of the flexible base substrate, and a plurality of wires are formed on the first organic insulating layer in the edge bending area of the flexible base substrate in step S604, the method may further comprise: sequentially forming a planarization layer and an organic light-emitting diode or quantum dot light-emitting diode on the conductive layer in the display area of the flexible base substrate.

Exemplarily, to better understand the manufacturing method provided in some embodiments of the present disclosure, FIGS. 7a-7d show schematically structural views of a flexible display panel obtained after each step in the above manufacturing method.

Figure 7A:
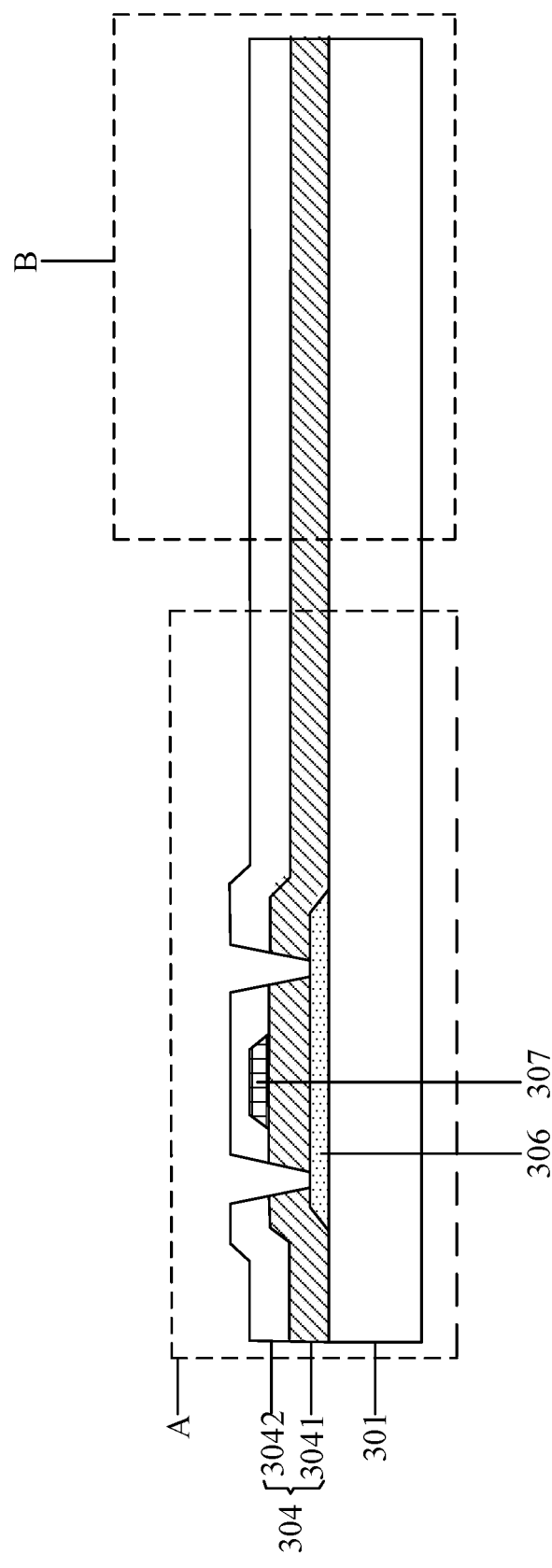
FIG. 7a to FIG. 7e are structural schematic views of a flexible display panel after each step in the manufacturing method thereof provided in an embodiment of the present disclosure.

As shown in FIG. 7a, a flexible base substrate 301 is provided; and an active layer 306, a gate insulating layer 3041, a gate electrode metal layer 307, a gate scanning line (not shown in the figures), and an interlayer insulating layer 3042 are sequentially formed on the flexible base substrate 301. The interlayer insulating layer 3042 may be an inter dielectric layer formed through an evaporation process.

Figure 7B:
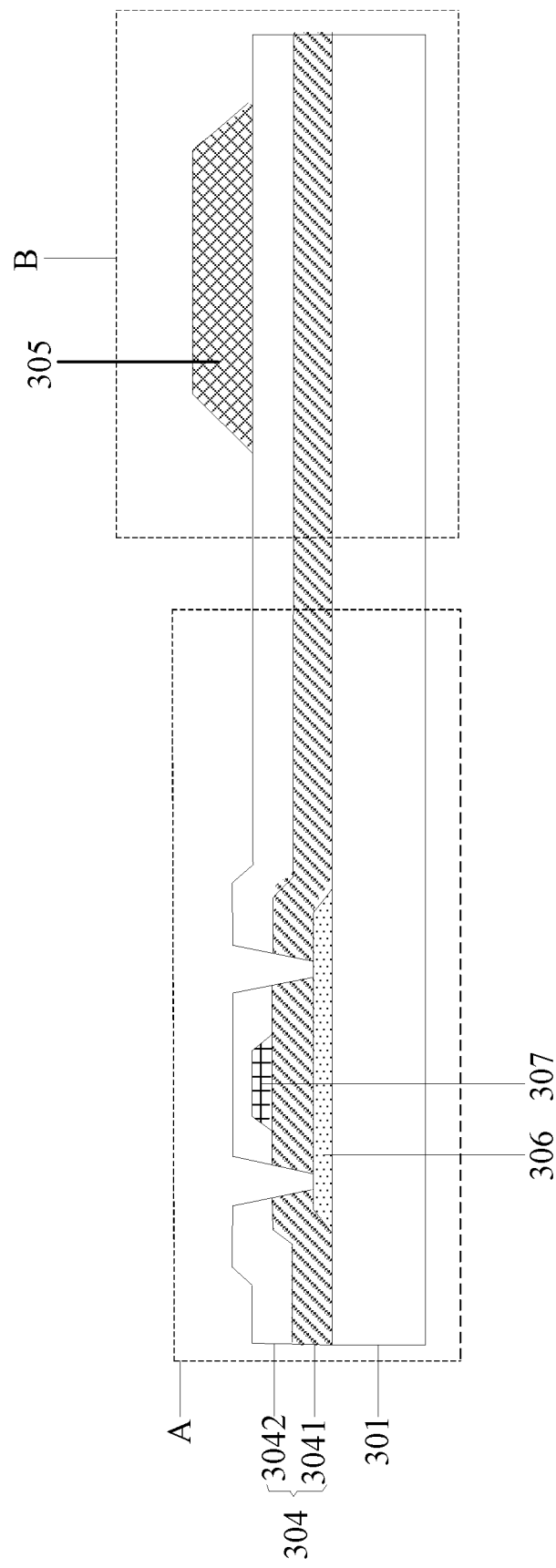

As shown in FIG. 7b, a first organic insulating layer 305 is formed on the interlayer insulating layer 3042 in the edge bending area B.

Figure 7C:
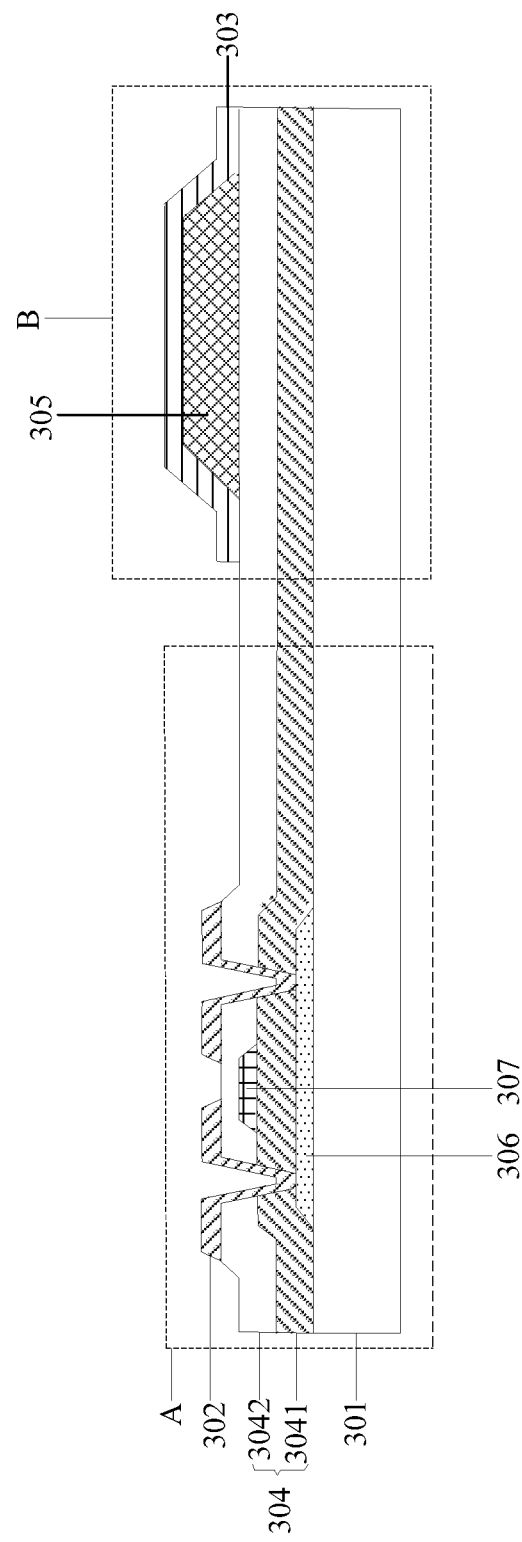

As shown in FIG. 7c, a conductive layer 302 is formed on the interlayer insulating layer 3042 in the display area A of the flexible base substrate; and meanwhile, a plurality of wires 303 are formed on the first organic insulating layer 305 in the bending area B of the flexible base substrate. The conductive layer 302 may form a signal line in the display area A as well as a source electrode and a drain electrode in a thin film transistor (TFT), and the plurality of wires 303 may form signal lines.

Figure 7D:
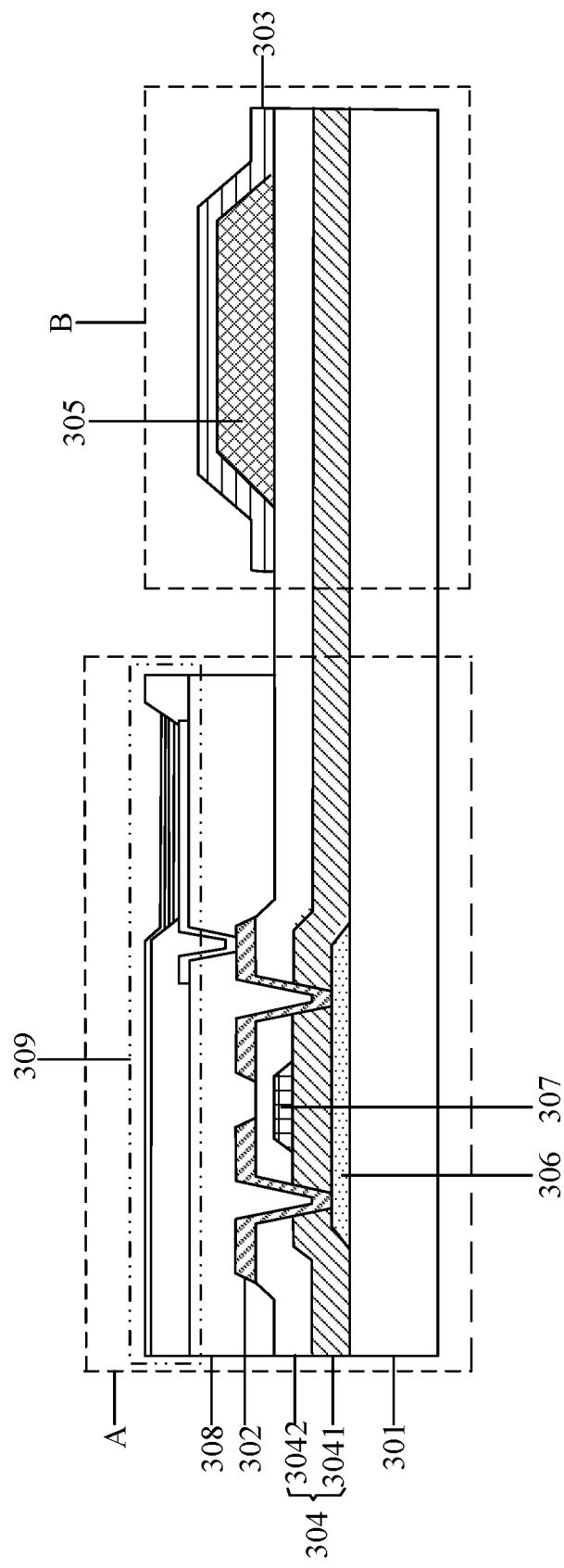

As shown in FIG. 7d, a planarization layer 308 and an organic light-emitting diode or quantum dot light-emitting diode 309 are sequentially formed on the conductive layer 302 in the display area A of the flexible base substrate. After that, the flexible base substrate may be bent from the edge bending area B of the flexible base substrate through pad bending.

Figure 7E:
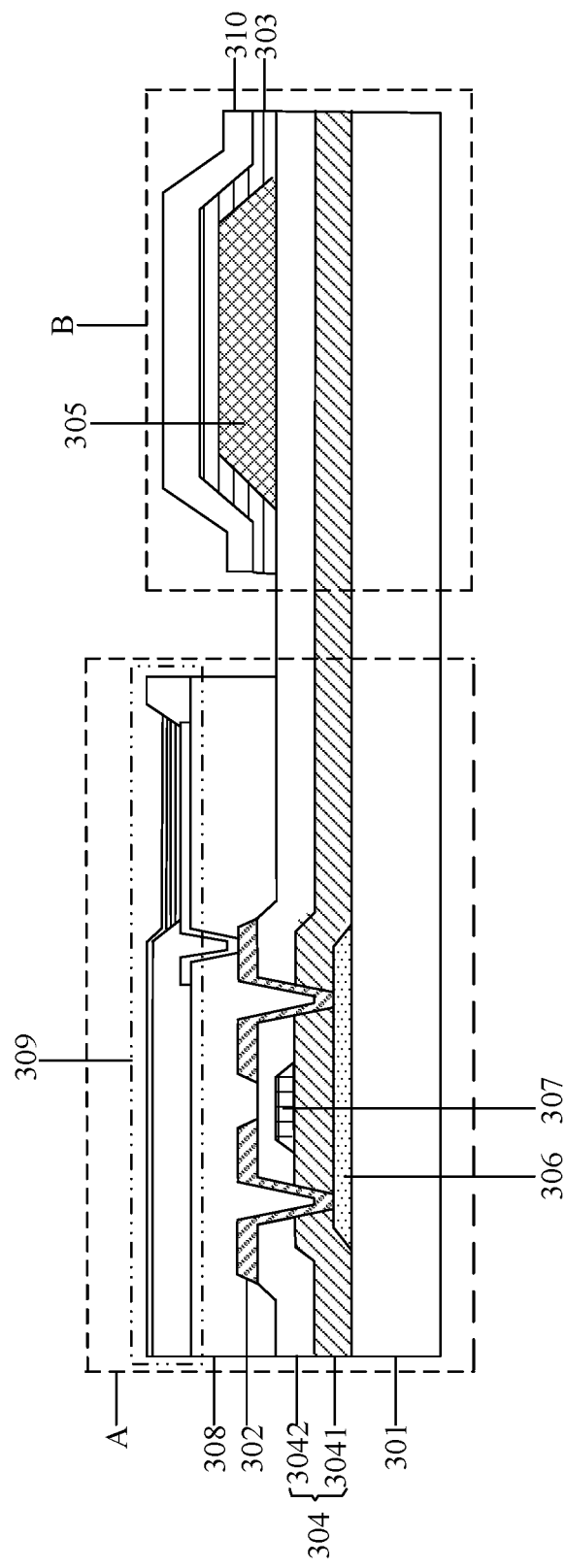

In addition, as shown in FIG. 7e, when the planarization layer 308 is formed in the display area A of the flexible base substrate, a second organic insulating layer 310 may also be formed in the edge bending area B at the same time. The planarization layer covering the edge bending zone B can effectively prevent the signal lines in the edge bending zone B from being scratched, thus the product quality is improved. The structure shown in FIG. 5 can be obtained by bending the flexible base substrate shown in FIG. 7e from the edge bending area B. For the meaning of other reference numerals in FIG. 7e, reference may be made to those in FIG. 5, and will not be repeated herein.

It should be noted that in the above manufacturing method provided in some embodiments, the patterning process involved in forming the structure of the layers comprises not only a part or all of photoresist coating, mask with a mask plate, exposure, developing, etching and photoresist stripping, but also other processes. The patterning process is determined based on a pattern required to be formed in an actual manufacturing process, and is not limited herein. For example, post-baking may also be included between developing and etching. Etching may be dry etching or wet etching, and is not limited herein. The various layers formed by the patterning process, such as the inorganic insulating layer, the first organic insulating layer, the conductive layer and the second organic insulating layer, may be provided with various shapes of openings at preset positions of the layers according to different functions of the layers. That is, the layers formed through the patterning process may be different patterns on the flexible base substrate. Exemplarily, the inorganic insulating layer may be provided with a via hole in the display area of the flexible base substrate. The source and drain electrodes may penetrate through the via hole to be in contact with the active layer below the inorganic insulating layer. When the first organic insulating layer is arranged in the display area of the flexible base substrate, another via hole corresponding to the via hole in the inorganic insulating layer may be formed in the first organic insulating layer to allow the source and drain electrodes to be in contact with the active layer below the inorganic insulating layer. Similarly, the source-drain electrode metal layer in the conductive layer may be a source-drain electrode pattern formed by source electrodes and drain electrodes distributed in the sub-pixel areas in the flexible base substrate.

In addition, the content of the material of the film layers in the flexible display panel prepared by the above manufacturing method provided in some embodiments may be made reference to the related content of the flexible display panel provided in some embodiments of the present disclosure, and details are not repeated herein.

Accordingly, as for the above flexible display panel provided in the aforesaid another embodiment of the present disclosure, there provides in another embodiment of the present disclosure a manufacturing method of a flexible display panel. Since the manufacturing method is similar to the above method, only the difference therebetween is introduced, and repeated descriptions are eliminated herein.

Figure 8A:
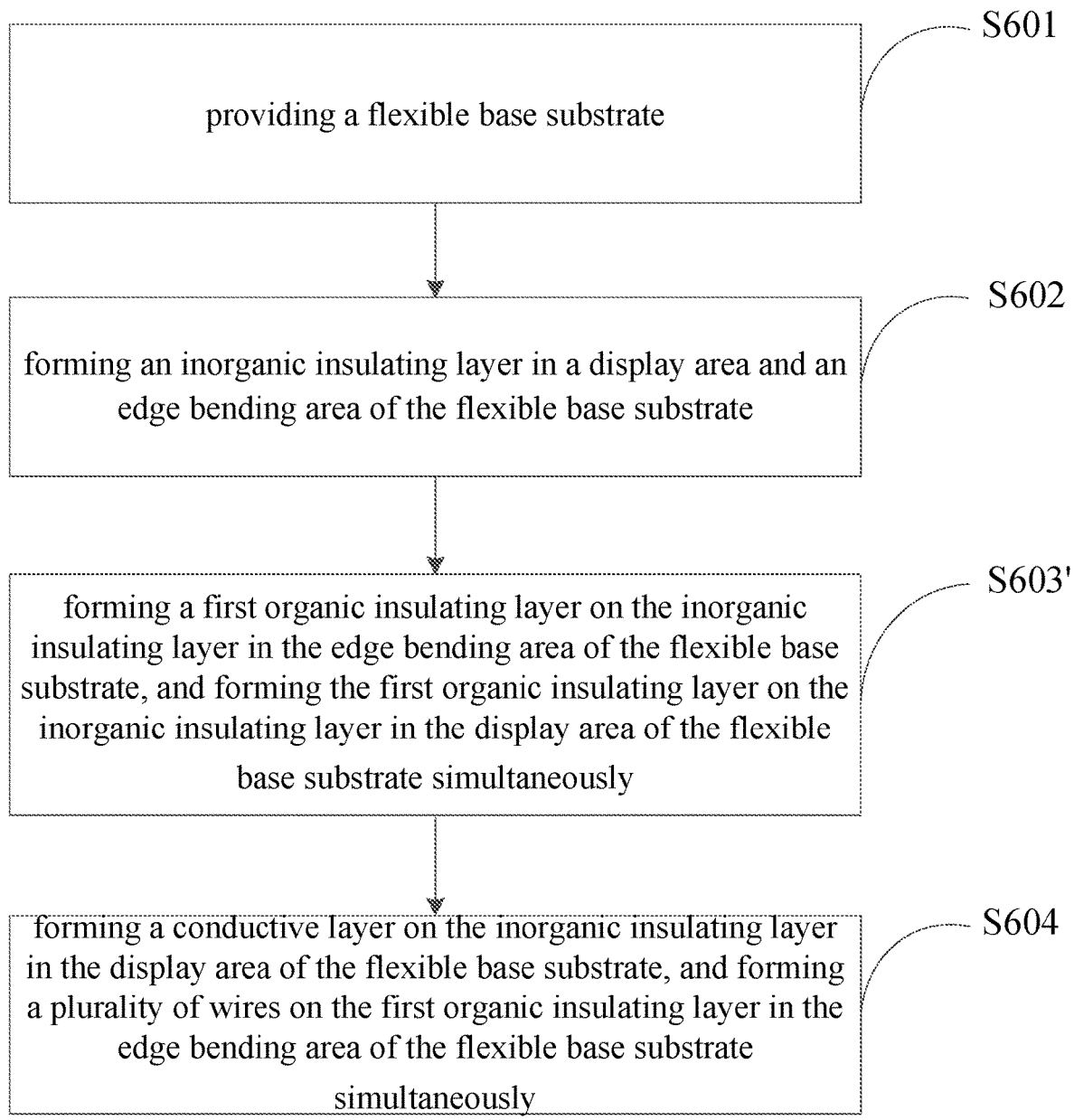
FIG. 8a is a flow chart of a method for manufacturing a flexible display panel provided in an embodiment of the present disclosure.
Figure 8B:
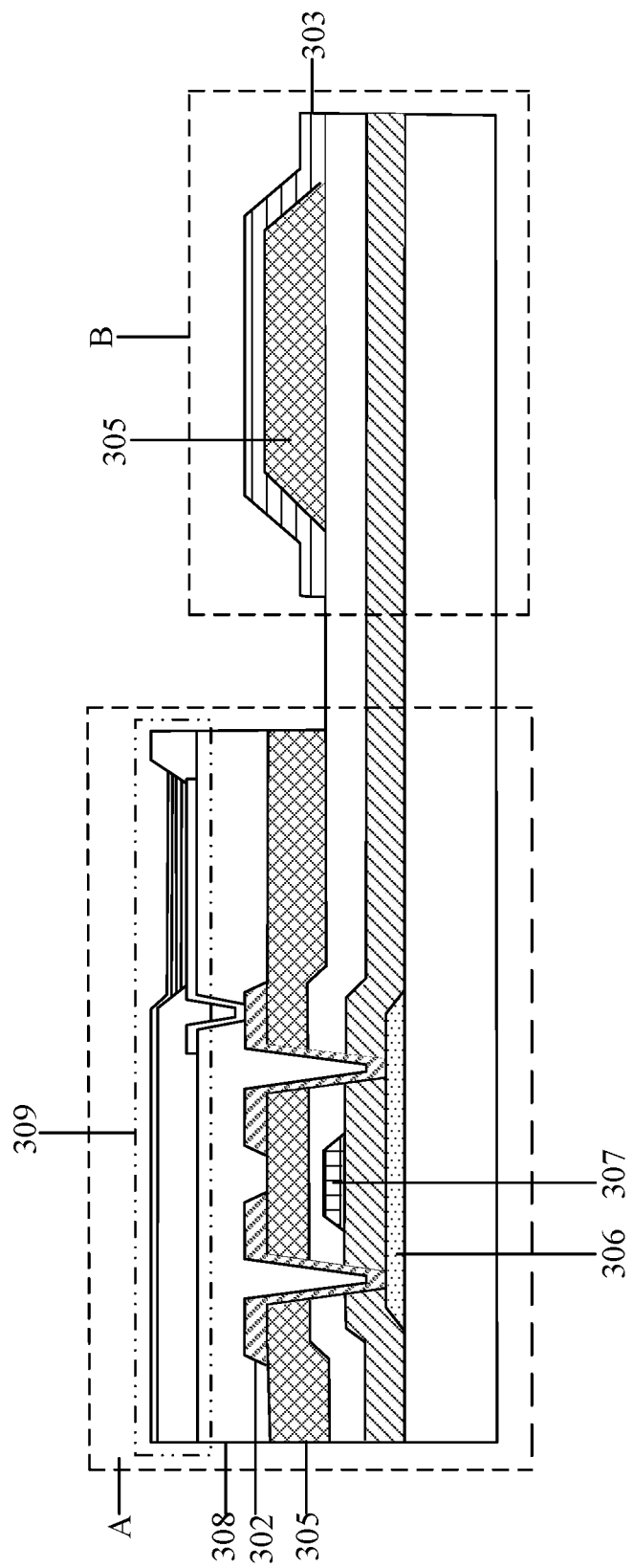
FIG. 8b is a structural schematic view of a flexible display panel in the manufacturing method thereof provided in an embodiment of the present disclosure.

Optionally, different from step S603 in the manufacturing method provided in Embodiment 4 where the first organic insulating layer is formed on the inorganic insulating layer in the edge bending area of the flexible base substrate, as shown in FIG. 8a, step S603' in the manufacturing method provided in some embodiments comprises: forming a first organic insulating layer on the inorganic insulating layer in the edge bending area of the flexible base substrate, and forming the first organic insulating layer on the inorganic insulating layer in the display area of the flexible base substrate simultaneously. That is, the first organic insulating layer is formed on the inorganic insulating layer in the edge bending area and in the display area of the flexible base substrate through a one-step patterning process. In this way, the organic insulating layer is additionally arranged between the conductive layer in the display area of the flexible base substrate and the gate scanning line (and the gate electrode metal layer on the same layer as the gate scanning line), so that the capacitance between the conductive layer and the gate scanning line (and the gate electrode metal layer on the same layer as the gate scanning line) is effectively reduced, which facilitates the improvement of the display image quality. Furthermore, the first organic insulating layer is formed through a one-step patterning process, and therefore the times of the patterning will not increase. Exemplarily, as shown in FIG. 8b, the first organic insulating layer 305 is formed between the conductive layer 302 and the gate electrode metal layer 307, so that the capacitance between the conductive layer 302 and the gate electrode metal layer 307 (and the gate scanning line on the same layer as the gate electrode metal layer 307) is reduced. The structure shown in FIG. 4 can be obtained by bending the flexible base substrate shown in FIG. 8b from the edge bending area B. For the meaning of other reference numerals in FIG. 8b, reference may be made to those in FIG. 4, and will not be repeated herein.

In addition, the content of the material of the film layers in the flexible display panel prepared by the above manufacturing method provided in some embodiments of the present disclosure may be made reference to the related content of the flexible display panel provided in some embodiments of the present disclosure, and details are not repeated herein. Accordingly, as for the above flexible display panel provided in the aforesaid yet another embodiment, there provides in a further embodiment a method for manufacturing a flexible display panel. Since the manufacturing method provided herein is similar to the above method, only the difference therebetween is introduced, and repeated descriptions are eliminated herein.

Figure 9:
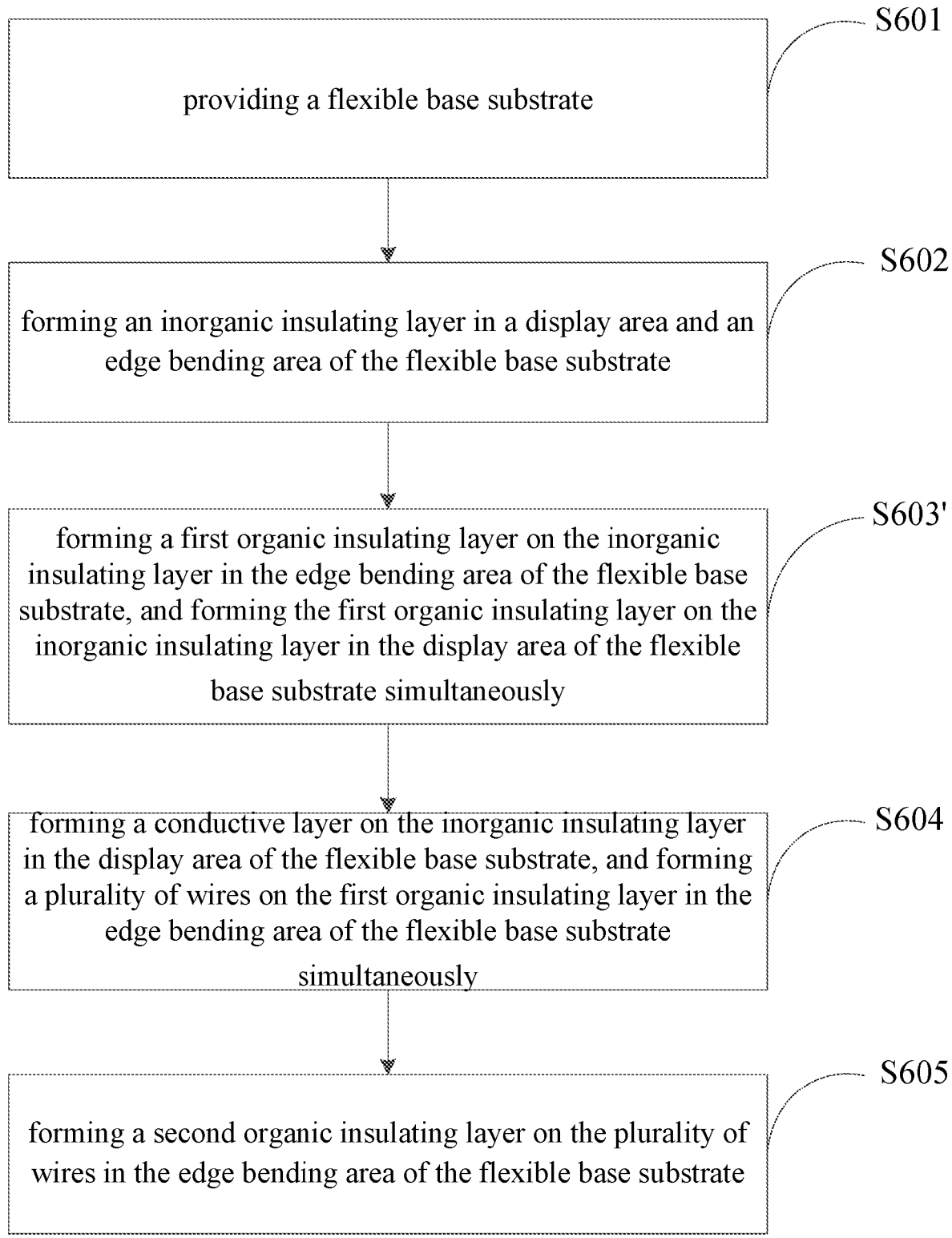
FIG. 9 is a flow chart of a method for manufacturing a flexible display panel provided in an embodiment of the present disclosure.

Exemplarily, in the method for manufacturing a flexible display panel provided in some embodiments of the present disclosure, after the plurality of wires are formed on the first organic insulating layer in the edge bending area of the flexible base substrate in S604, as shown in FIG. 9, optionally, the method provided in some embodiments may further include: S605, a second organic insulating layer is formed on the plurality of wires in the edge bending area of the flexible base substrate. In this way, the second organic insulating layer can protect the plurality of wires from being scratched, and thus the display image quality is improved.

Exemplarily, in step S605 of the above manufacturing method provided in some embodiments, forming the second organic insulating layer on the plurality of wires in the bending area of the flexible base substrate may be implemented through the following manner.

The second organic insulating layer is formed on the plurality of wires in the bending area of the flexible base substrate simultaneously when the planarization layer is formed on the conductive layer in the display area of the flexible base substrate.

Exemplarily, as the pixel organic layer in the display area A of the flexible base substrate generally comprises a planarization layer, a photo spacer layer and a pixel definition layer, in step S605 of the manufacturing method provided in some embodiments, forming the second organic insulating layer on the plurality of wires of in the bending area of the flexible base substrate may further be implemented through the following manner.

The second organic insulating layer is formed on the plurality of wires in the bending area of the flexible base substrate simultaneously when the photo spacer layer or the pixel definition layer is formed on the conductive layer in the display area of the flexible base substrate. That is, the planarization layer, the photo spacer layer or the pixel definition layer may formed in the display area of the flexible base substrate simultaneously when the second organic insulating layer is formed on the plurality of wires in the bending area of the flexible base substrate through a one-step patterning process, thereby reducing the times of the patterning, which is not limited in the embodiments of the present disclosure.

In addition, content of the material of the film layers in the flexible display panel provided in some embodiments may be made reference to the related content of the flexible display panel provided in some embodiments of the present disclosure, and details are not repeated herein.

Based on the same concept, an embodiment of the present disclosure further provides a display device including the above flexible display panel. The display device may be a mobile phone, a tablet computer, a television, a display, a laptop computer, a digital photo frame, a navigator or any other product or part with a display function. The embodiment of the display device may be made reference to the embodiments of the flexible display panel, and repeated descriptions are eliminated herein.

The embodiments of the present disclosure provide a flexible display panel, a manufacturing method thereof and a display device. The flexible display panel includes a flexible base substrate, a conductive layer arranged in a display area of the flexible base substrate, a plurality of wires arranged in an edge bending area of the flexible base substrate, and an inorganic insulating layer, wherein the inorganic insulating layer is arranged between the conductive layer and the flexible base substrate, and between the plurality of wires and the flexible base substrate. The conductive layer is electrically connected with the plurality of wires. The flexible display panel further includes: a first organic insulating layer which is at least arranged in the edge bending area of the flexible base substrate, and is located between the plurality of wires and the inorganic insulating layer. A first organic insulating layer is arranged on the edge bending area of the flexible base substrate, and is located between the plurality of wires and the inorganic insulating layer. Therefore, when there is a crack in the inorganic insulating layer in the edge bending area of the flexible base substrate, the crack is effectively prevented from extending to a film layer of the plurality of wires as the first organic insulating layer located between the wires and the inorganic insulating layer plays a shielding action, and thus, display failure is avoided. In addition, compared with the technical solution in the prior art that the mask process is performed twice additionally, the present disclosure only add one mask process for manufacturing the first organic insulating layer, so that the other mask process for removing the inorganic insulating layer in the edge bending area of the flexible base substrate is eliminated, thereby reducing the production cost and improving the production efficiency.

Modifications and variations to the present disclosure can be available to those skilled in the art without departing from spirit and scope of the present disclosure. The specification and examples can be shown as illustrative only, and the true scope and spirit of the disclosure are indicated by the following claims. The present disclosure is intended to cover these modifications and variations under the condition that modifications and variations fall into the scope of protection of the claims of the present disclosure and the equivalent techniques.

What is claimed is:

1. A flexible display panel, comprising: a flexible base substrate, a plurality of wires arranged in an edge bending area of the flexible base substrate, and an inorganic insulating layer, wherein the inorganic insulating layer is arranged between the plurality of wires and the flexible base substrate; and the flexible display panel further comprises:
a first organic insulating layer which is at least arranged in the edge bending area of the flexible base substrate, and is located between the plurality of wires and the inorganic insulating layer.

2. The flexible display panel of claim 1, further comprising: a conductive layer arranged in a display area of the flexible base substrate, wherein the inorganic insulating layer is arranged between the conductive layer and the flexible base substrate; and the conductive layer is electrically connected with the plurality of wires.

3. The flexible display panel of claim 2, wherein the first organic insulating layer is further arranged in the display area of the flexible base substrate, and is located between the conductive layer and the inorganic insulating layer.

4. The flexible display panel of claim 3, wherein the conductive layer and the plurality of wires are arranged on the same layer.

5. The flexible display panel of claim 4, wherein the conductive layer is a source-drain electrode metal layer.

6. The flexible display panel of claim 3, wherein the inorganic insulating layer comprises a gate insulating layer and an interlayer insulating layer.

7. The flexible display panel of claim 2, wherein the first organic insulating layer is made of polyimide or polymethyl methacrylate.

8. The flexible display panel of claim 2, further comprising: a second organic insulating layer at least arranged in the edge bending area of the flexible base substrate, and located on the plurality of wires.

9. The flexible display panel of claim 8, wherein the second organic insulating layer is arranged on the same layer as a planarization layer, a photo spacer layer or a pixel definition layer arranged in the display area of the flexible base substrate.

10. The flexible display panel of claim 1, further comprising: an organic light-emitting diode or a quantum dot light-emitting diode arranged above the conductive layer in the display area of the flexible base substrate.

11. The flexible display panel of claim 1, wherein the conductive layer and the plurality of wires are made of one or an alloy combination of molybdenum, aluminum, tungsten, titanium and copper.

12. The flexible display panel of claim 1, wherein the conductive layer and the plurality of wires are a composite metal layer made of titanium, aluminum and titanium.

13. The flexible display panel of claim 1, wherein the planarization layer is made of polyacrylic resin, polyepoxy acrylic resin, photosensitive polyimide resin, polyester acrylate, urethane acrylate resin, or phenolic epoxy acrylate resin.

14. A display device, comprising: a flexible display panel; wherein the flexible display panel comprises: a flexible base substrate, a plurality of wires arranged in an edge bending area of the flexible base substrate, and an inorganic insulating layer, wherein the inorganic insulating layer is arranged between the plurality of wires and the flexible base substrate; and
the flexible display panel further comprises: a first organic insulating layer which is at least arranged in the edge bending area of the flexible base substrate, and is located between the plurality of wires and the inorganic insulating layer.

15. A manufacturing method of a flexible display panel, comprising:
providing a flexible base substrate;
forming an inorganic insulating layer in a display area and an edge bending area of the flexible base substrate;
forming a first organic insulating layer on the inorganic insulating layer in the edge bending area of the flexible base substrate; and
forming a conductive layer on the inorganic insulating layer in the display area of the flexible base substrate, and forming a plurality of wires on the first organic insulating layer in the edge bending area of the flexible base substrate simultaneously, the conductive layer being electrically connected with the plurality of wires.

16. The manufacturing method of claim 15, wherein forming the first organic insulating layer on the inorganic insulating layer in the edge bending area of the flexible base substrate comprises:
forming the first organic insulating layer on the inorganic insulating layer in the edge bending area and the display area of the flexible base substrate by a one-step patterning process.

17. The manufacturing method of claim 16, wherein the conductive layer is a source-drain electrode metal layer; and forming the inorganic insulating layer in the display area and the edge bending area of the flexible base substrate comprises:

sequentially forming a gate insulating layer and an interlayer insulating layer in the display area and the edge bending area of the flexible base substrate.

18. The manufacturing method of claim 16, wherein after forming the conductive layer on the inorganic insulating layer in the display area of the flexible base substrate, and forming the plurality of wires on the first organic insulating layer in the edge bending area of the flexible base substrate simultaneously, the manufacturing method further comprises:

forming a second organic insulating layer on the plurality of wires in the edge bending area of the flexible base substrate.

19. The manufacturing method of claim 18, wherein forming the second organic insulating layer on the plurality of wires in the edge bending area of the flexible base substrate comprises:

forming a planarization layer, a photo spacer layer or a pixel definition layer in the display area of the flexible base substrate while forming the second organic insulating layer on the plurality of wires in the edge bending area of the flexible base substrate through a one-step patterning process.

* * * * *